(12) United States Patent
Yang (10) Patent No.: US 12,262,507 B2
(45) Date of Patent: Mar. 25, 2025

(54) HEAT DISSIPATION STRUCTURE (71) Applicant: CLEVO CO., New Taipei (TW)

(72) Inventor: Chi-Hsueh Yang, Taipei (TW)

(73) Assignee: CLEVO CO., New Taipei (TW)

( * ) Notice: Subject to any disclaimer, the term of this patent is extended or adjusted under 35 U.S.C. 154(b) by 212 days.

(21) Appl. No.: 17/873,311

(22) Filed: Jul. 26, 2022

(65) Prior Publication Data
US 2023/0112596 A1 Apr. 13, 2023

(30) Foreign Application Priority Data
Oct. 8, 2021 (TW) .................................. 110211851

(51) Int. Cl.
H05K 7/20 (2006.01)

(52) U.S. Cl.
CPC .................................. H05K 7/2029 (2013.01)

(58) Field of Classification Search
CPC .............. H05K 7/2029; H01L 23/3736; H01L 23/4275; G06F 1/20; Y02D 10/00
USPC ..................... 361/185, 514, 676, 679.54, 688
See application file for complete search history.

(56) References Cited

U.S. PATENT DOCUMENTS

| | | | | |
|---|---|---|---|---|
| 2002/0012762 A1* | 1/2002 | Bunyan | ................... | H01L 23/36 257/E23.101 |
| 2004/0240181 A1* | 12/2004 | Chung | ................... | H01L 23/40 257/E23.083 |
| 2005/0245659 A1* | 11/2005 | Chen | ................... | H01L 23/42 524/439 |
| 2006/0198107 A1* | 9/2006 | Azar | ................... | H01L 23/4093 257/E23.105 |
| 2009/0268409 A1* | 10/2009 | Zhou | ................... | H01L 23/34 361/710 |
| 2010/0018670 A1* | 1/2010 | Azar | ................... | H01L 23/4093 165/185 |

FOREIGN PATENT DOCUMENTS

| CN | 106025426 A | * | 10/2016 | |
|---|---|---|---|---|
| WO | WO-2018121173 A1 | * | 7/2018 | ............. F28D 20/02 |

\* cited by examiner

Primary Examiner — Thienvu V Tran
Assistant Examiner — Sreeya Sreevatsa
(74) Attorney, Agent, or Firm — Li & Cai Intellectual Property (USA) Office (57) ABSTRACT A heat dissipation structure is provided. The heat dissipation structure includes a heat dissipation unit and a fixation unit. The fixation unit has a bottom and a wall that jointly define a hollow area. The fixation unit is surroundingly arranged on a periphery of a heating source. The hollow area has a first non-masking area, a second non-masking area, and a masking area. The masking area corresponds to at least one part of the heat dissipation unit, and the first non-masking area and the second non-masking area are respectively arranged on opposite sides of the masking area. The first non-masking area has a first volume, the second non-masking area has a second volume, and a sum of the first volume and the second volume is at least greater than a predetermined volume change of the heat dissipation unit.

10 Claims, 6 Drawing Sheets

HEAT DISSIPATION STRUCTURE

CROSS-REFERENCE TO RELATED PATENT APPLICATION

This application claims the benefit of priority to Taiwan Patent Application No. 110211851, filed on Oct. 8, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a heat dissipation structure, and more particularly to a heat dissipation structure for a heat dissipation unit formed by liquid metal.

BACKGROUND OF THE DISCLOSURE

Recently, miniaturization is the trend for the development and design of common electronic components. Electronic components, such as central processing units (CPUs) and graphics processing units (GPUs), are easily to generate high heat energy during actual operation due to miniaturization or highly increased performance, which affects overall operation performance. Therefore, a vapor chamber is often applied to dissipate the heat energy.

In conventional heat structures, a heat sink is disposed on the electronic component, and then a fan unit is used to guide airflow, so as to transfer the heat energy generated by the electronic component to an outside of a housing. However, since components inside the housing are arranged close to each other, the heat generated by a heat source cannot be effectively discharged to the outside, resulting in a temperature rise effect inside the housing. Moreover, accumulation of the heat energy forms a vicious circle. If the temperature inside the housing cannot be maintained in a normal range, reliability and service life of the overall electronic component will be affected, and an electrical leakage problem and high temperature during overclocking will also occur.

In addition, a metal cooling fin having a high heat dissipation coefficient is required to effectively improve heat dissipation efficiency. However, an overflow generated by a phase change of the metal cooling fin may easily lead to a short circuit of a main board, and an uneven distribution of heating positions of the heat source may also result in unstable heat dissipation.

Therefore, how to improve the heat dissipation effect of the heat dissipation structure through an improvement of the structural design to overcome the above defects has become one of the important issues to be addressed in the related field.

SUMMARY OF THE DISCLOSURE

In response to the above-referenced technical inadequacies, the present disclosure provides a heat dissipation structure.

In one aspect, the present disclosure provides a heat dissipation structure, which includes a heat dissipation unit and a fixation unit. The fixation unit has a bottom and a wall, and the bottom and the wall jointly define a hollow area. The fixation unit is surroundingly arranged on a periphery of a heating source. The hollow area has a first non-masking area, a second non-masking area, and a masking area. The masking area corresponds to at least one part of the heat dissipation unit, and the first non-masking area and the second non-masking area are respectively arranged on opposite sides of the masking area. The first non-masking area has a first volume, the second non-masking area has a second volume, and the first volume is equal to or not equal to the second volume. A sum of the first volume and the second volume is at least greater than a predetermined volume change of the heat dissipation unit.

In certain embodiments, the heat dissipation unit has a first state and a second state.

In certain embodiments, the heat dissipation unit is formed by liquid metal.

In certain embodiments, a ratio of the sum of the first volume and the second volume to a volume of the heat dissipation unit is at least greater than 0.05.

In certain embodiments, the ratio of the sum of the first volume and the second volume to the volume of the heat dissipation unit is at least greater than 0.1.

In certain embodiments, the fixation unit further has at least one recess, the at least one recess is adjacent to the masking area, and a top surface of the at least one recess is adjacent to at least another part of the heat dissipation unit.

In certain embodiments, as viewed in a section along a thickness of the fixation unit, the at least one recess has a rectangular shape, a jagged edge shape, or a circular arc edge shape.

In certain embodiments, as viewed in the section along the thickness of the fixation unit, the at least one recess has a trapezoidal shape.

In certain embodiments, the heat source is a central processing unit (CPU), a graphics processing unit (GPU), a microcontroller (MCU), a microprocessor (MPU), or an application specific integrated circuit (ASIC).

In certain embodiments, the heat dissipation unit is adhered to a top surface of each of two parts of the wall of the fixation unit that are opposite to each other through an insulating tape.

In certain embodiments, the fixation unit is directly placed on the periphery of the heat source, or the fixation unit is adhered to the periphery of the heat source through an insulating tape.

Therefore, one of the beneficial effects of the present disclosure is that, in the heat dissipation structure provided by the present disclosure, by virtue of "the hollow area has the first non-masking area, the second non-masking area, and the masking area, the masking area corresponds to the at least one part of the heat dissipation unit, and the first non-masking area and the second non-masking area are respectively arranged on the opposite sides of the masking area", "the first non-masking area has a first volume, the second non-masking area has a second volume, the first volume is equal to or not equal to the second volume, and the sum of the first volume and the second volume is at least greater than the predetermined volume change of the heat dissipation unit", and "the fixation unit further has the at least one recess, the at least one recess is adjacent to the masking area, and the top surface of the at least one recess is adjacent to the at least another part of the heat dissipation unit," an electrical leakage during assembly of a metal cooling fin due to an electrical conductivity between components can be reduced, so that an underclocking during operation of a high power chip can be avoided. Moreover, the heat dissipation structure provided by the present disclosure can be applied to solve a problem of high temperature during overclocking, which results in improved stability of heat dissipation during repetitive testing.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 7, a first embodiment of the present disclosure provides a heat dissipation structure, which includes a heat dissipation unit 1 and a fixation unit 2. The heat dissipation unit 1 is disposed on the fixation unit 2, and the fixation unit 2 is surroundingly arranged on a periphery of a heat source 3.

Figure 1:
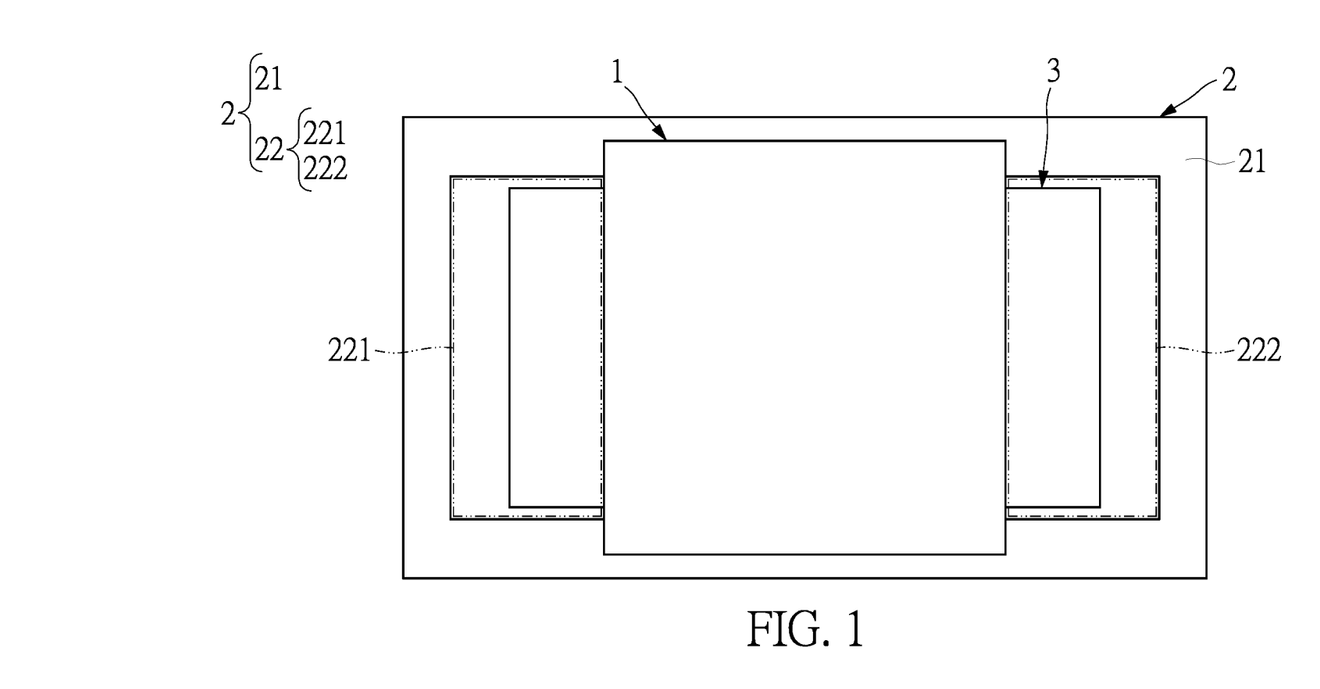
FIG. 1 is a schematic top view of a heat dissipation structure according to a first embodiment of the present disclosure.
Figure 2:
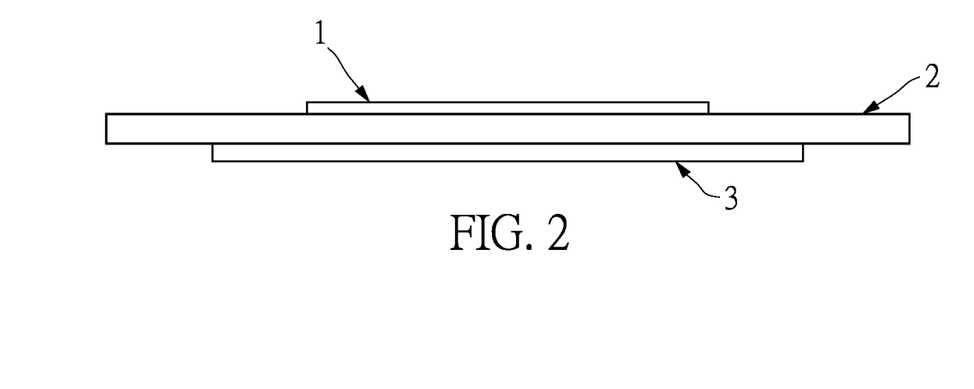
FIG. 2 is a schematic side view of the heat dissipation structure according to the first embodiment of the present disclosure.

The heat dissipation unit 1 may include a heat dissipation material having a high heat dissipation coefficient, and the heat dissipation unit 1 may have a first state and a second state. For example, the first state can be a solid state and the second state can be a liquid state, but the present disclosure is not limited thereto. In one particular embodiment, the heat dissipation unit 1 can be formed by liquid metal.

Referring to FIG. 1, and FIG. 3 to FIG. 7, the fixation unit 2 is a hollow frame structure. A shape and a size of the fixation unit 2 are not limited, and can be adjusted and designed according to the heat dissipation unit 1 or practical requirements. In addition, the fixation unit 2 has a thickness, which can be adjusted according to a size of the heat source 3. In one embodiment, the thickness of the fixation unit 2 can be 0.1 mm to 2.0 mm, and preferably 0.2 mm to 0.5 mm.

Specifically, referring to FIG. 1, and FIG. 3 to FIG. 7, the fixation unit 2 has a bottom (not labeled in the figures) and a wall 21, and the bottom and the wall 21 jointly define a hollow area 22. The hollow area 22 includes a first non-masking 221, a second non-masking area 222, and a masking area 223, and the wall 21 surrounds the first non-masking area 221, the second non-masking area 222, and the masking area 223. Further, as shown in FIG. 1, when the heat dissipation unit 1 is disposed on the fixation unit 2 by contacting the wall 21, at least one part of the heat dissipation unit 1 covers at least a part of the hollow area 22 as viewed from a top of the heat dissipation structure of the present disclosure. In other words, the hollow area 22 of the fixation unit 2 can be divided into the first non-masking area 221, the second non-masking area 222, and the masking area 223, in which a position of the masking area 223 corresponds to the at least one part of the heat dissipation unit 1, and the first non-masking area 221 and the second non-masking area 222 are arranged on opposite sides (e.g., a left side and a right side) of the masking area 223.

It should be noted that, the heat dissipation unit 1 can be fixedly or non-fixedly disposed on the fixation unit 2 according to user's demands or practical requirements by conventional techniques, and preferably, the heat dissipation unit 1 can be adhered to a top surface of each of two parts of the wall 21 of the fixation unit 2 that are opposite to each other through an insulating tape.

Further, the first non-masking area 221 has a first volume, the second non-masking area 222 has a second volume, and the first volume may be equal to or not equal to the second volume. A sum of the first volume and the second volume is at least greater than a predetermined volume change of the heat dissipation unit 1. Specifically, when the heat dissipation unit 1 changes from the first state to the second state (e.g., form the solid state to the liquid state) by absorbing heat energy generated by the heat source 3, the predetermined volume change of the heat dissipation unit 1 occurs. Through the design that the sum of the first volume and the first volume and the second volume is at least greater than the predetermined volume change of the heat dissipation unit 1, the first non-masking area 221 and the second non-masking area 222 can accommodate a volume change of the heat dissipation unit 1 due to a phase change. In one particular embodiment, the heat dissipation unit 1 is a liquid metal, and the heat dissipation unit 1 has a predetermined volume change of 1.01 to 1.05 times an original volume of the heat dissipation unit 1. Therefore, through a design that a ratio of the sum of the first volume and the second volume to the original volume of the heat dissipation unit 1 is at least greater than 0.05, and preferably at least greater than 0.1, the first non-masking area 221 and the second non-masking area 222 can accommodate the volume change of the heat dissipation unit 1 due to the phase change.

In one embodiment, with reference to FIG. 3 to FIG. 7, the wall 21 may also have at least one recess 211. In one particular embodiment, a number of the recess 211 is two, and the two recesses 211 are respectively arranged on two opposite inner sides of the wall 21 and correspond to each other. In addition, the two recesses 211 each are adjacent to the masking area 223. Specifically, when the heat dissipation unit 1 is disposed on the fixation unit 2 by contacting the wall 21, at least another part of the heat dissipation unit 1 covers the at least one recesses 211 of the fixation unit 2 as viewed from the top of the heat dissipation structure of the present disclosure. In other words, a top surface of the at least one recess 211 is adjacent to the at least another part of the heat dissipation unit 1. In this way, when the heat dissipation unit 1 absorbs the heat energy generated by the heat source 3 to cause the phase change and the volume change, a volume of the heat dissipation unit 1 that is expanded can be concentrated in the at least one recess 211, so as to avoid a short circuit caused by an overflow of the heat dissipation unit 1.

Further, an arrangement of the at least one recess 211 can be adjusted according to a position of the heat dissipation unit 1, and an arrangement of the heat dissipation unit 1 can be adjusted according to a position of the heat energy generated by heat source 3. That is, the position of the at least one recess 211 and the position of the heat dissipation unit 1 are arranged according to the position of the heat energy generated by heat source 3. In one particular embodiment, with reference to FIG. 3, when the heat energy generated by the heat source 3 is concentrated in a surrounding area of a center of the heat source 3, the heat dissipation unit 1 is disposed on the fixation unit 2 corresponding to the center of the heat source 3, and the at least one recess 211 corresponds to the center of the heat source 3. Through the above-mentioned design, the first volume of the first non-masking area 221 is substantially equal to the second volume of the second non-masking area 222.

Figure 4:
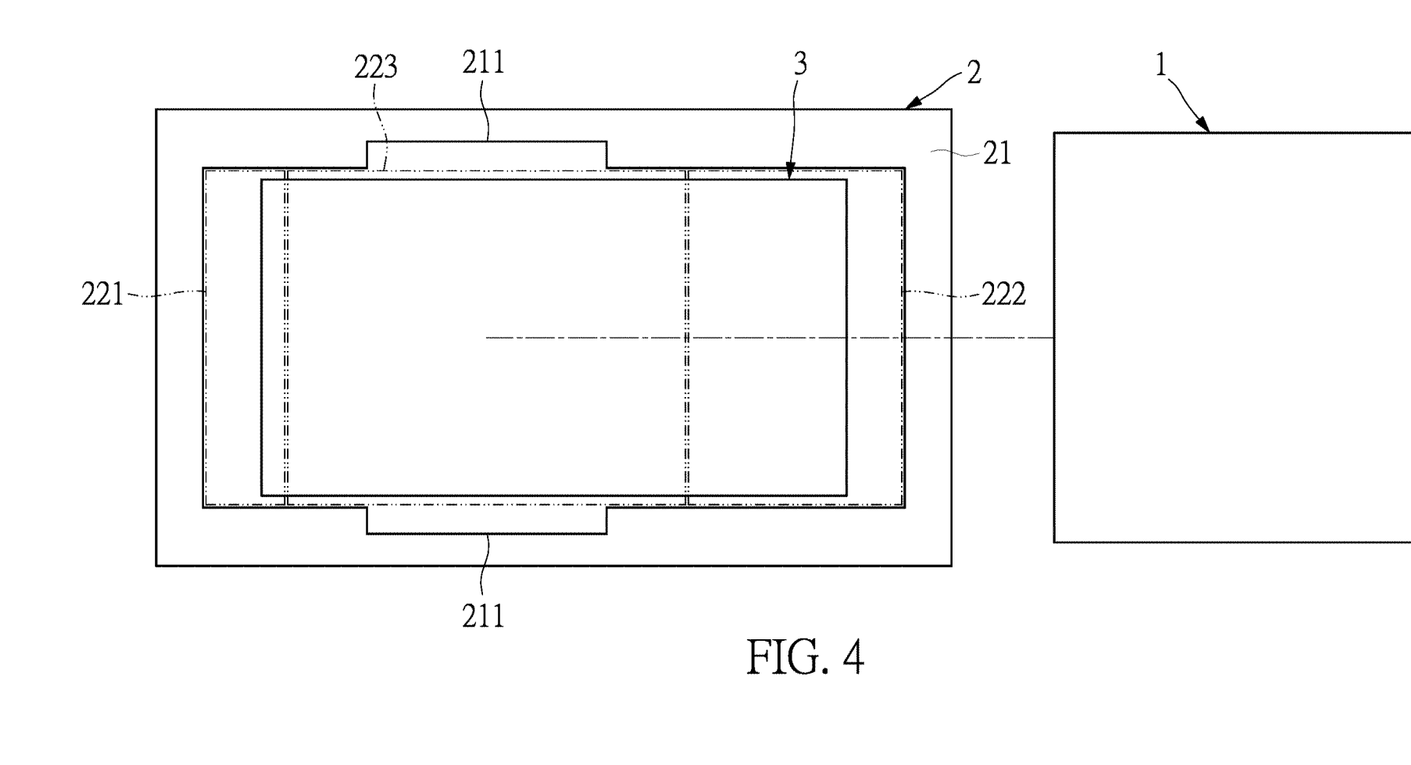
FIG. 4 is another schematic top view of the heat dissipation structure with the heat dissipation unit removed according to the first embodiment of the present disclosure.

In another embodiment, with reference to FIG. 4, when the heat energy generated by the heat source 3 is concentrated on one side near the first non-masking area 221 (i.e., away from the second non-masking area 222), the heat dissipation unit 1 is disposed on the fixation unit 2 in a direction toward the first non-masking area 221, which corresponds to the position of the heat energy generated by the heat source 3, and the at least one recess 211 corresponds to the position of the heat energy generated by the heat source 3. Through the above-mentioned design, the first volume of the first non-masking area 221 is less than the second volume of the second non-masking area 222.

Figure 5:
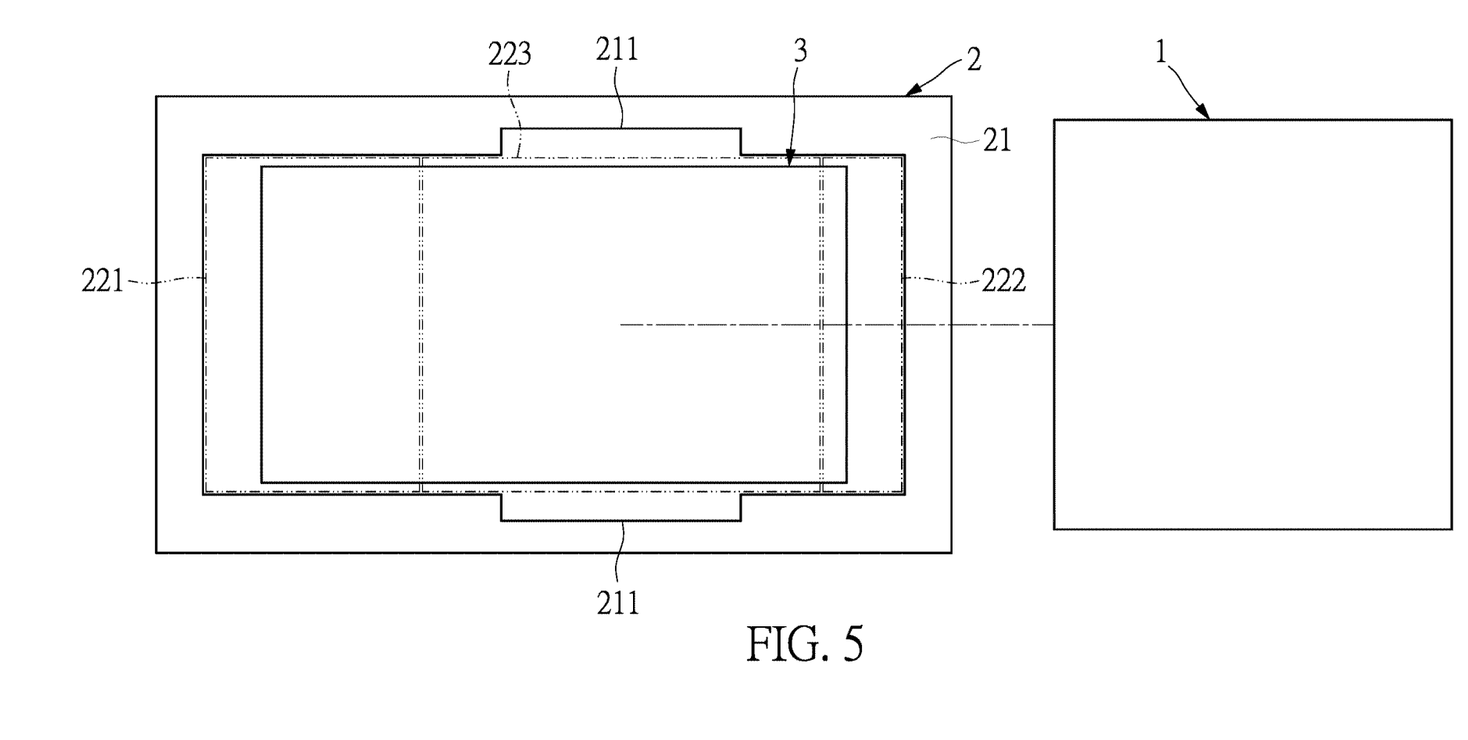
FIG. 5 is yet another schematic top view of the heat dissipation structure with the heat dissipation unit removed according to the first embodiment of the present disclosure.

In yet another embodiment, with reference to FIG. 5, when the heat energy generated by the heat source 3 is concentrated on another side away from the first non-masking area 221 (i.e., near the second non-masking area 222), the heat dissipation unit 1 is disposed on the fixation unit 2 in a direction toward the second non-masking area 222, which corresponds to the position of the heat energy generated by the heat source 3, and the at least one recess 211 corresponds to the position of the heat energy generated by the heat source 3. Through the above-mentioned design, the first volume of the first non-masking area 221 is greater than the second volume of the second non-masking area 222.

Figure 3:
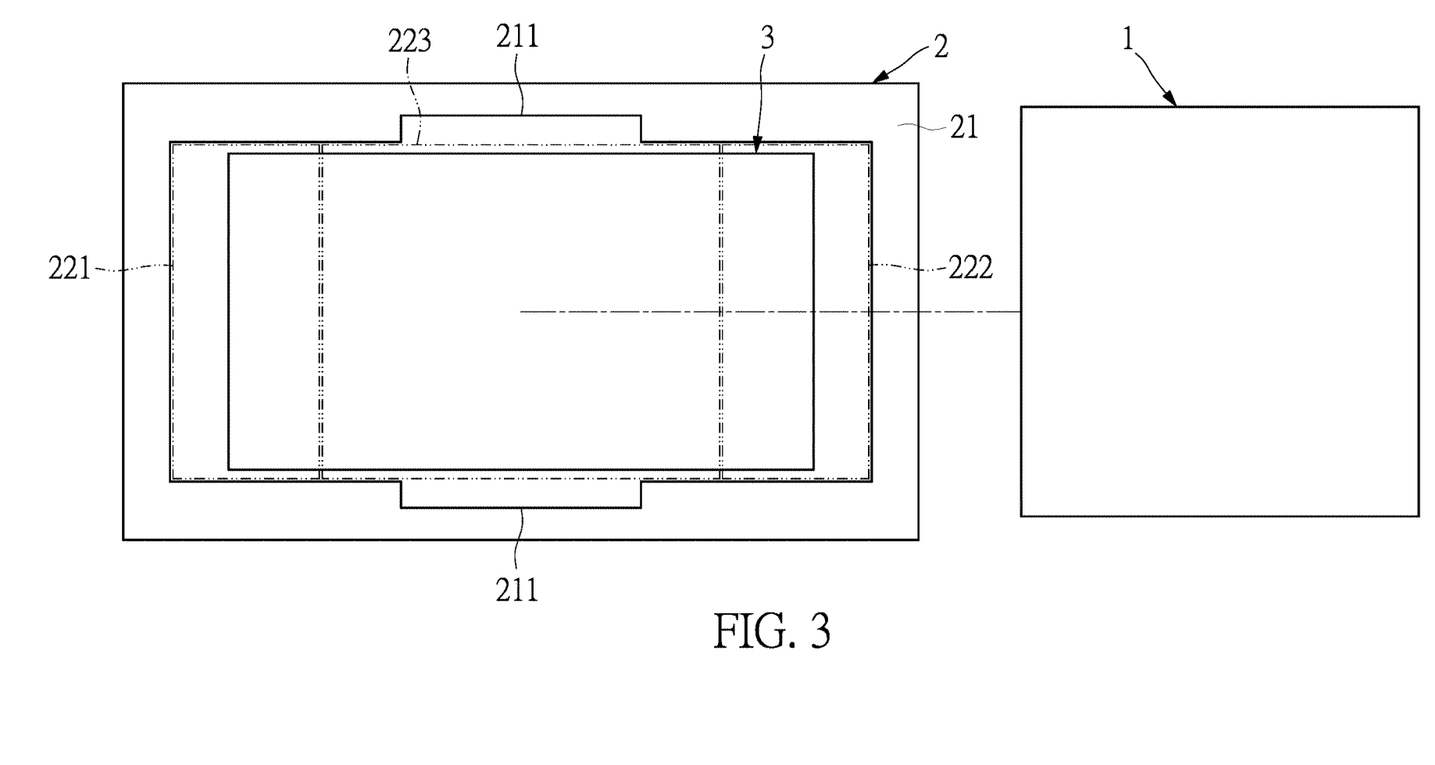
FIG. 3 is a schematic top view of the heat dissipation structure with a heat dissipation unit removed according to the first embodiment of the present disclosure.
Figure 6:
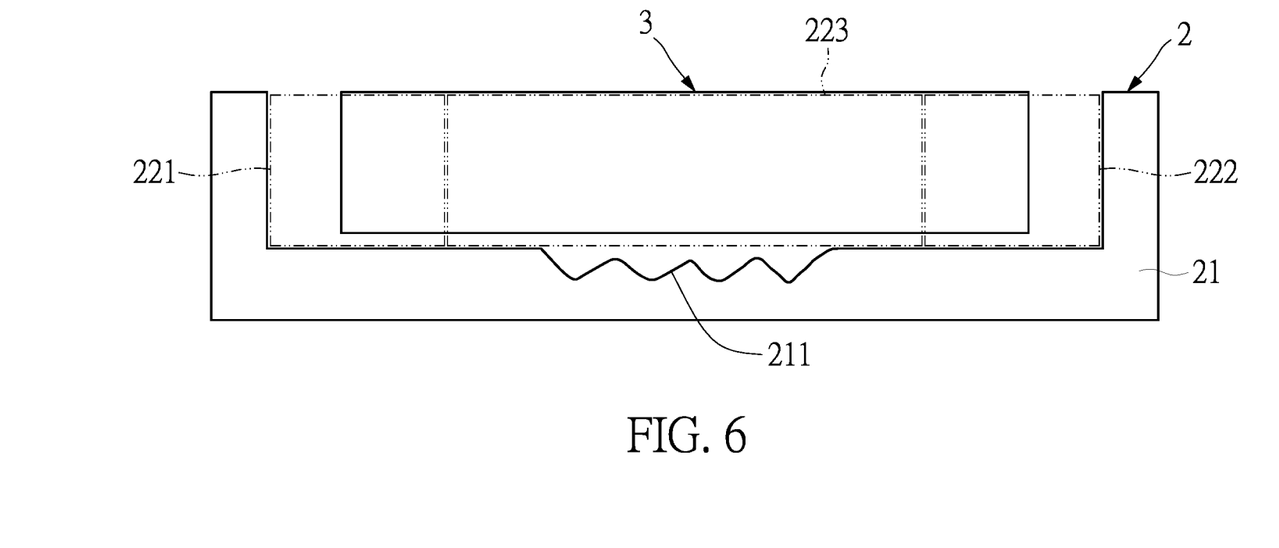
FIG. 6 is a partial top view of a fixation unit and a heat source of the heat dissipation structure according to the first embodiment of the present disclosure.
Figure 7:
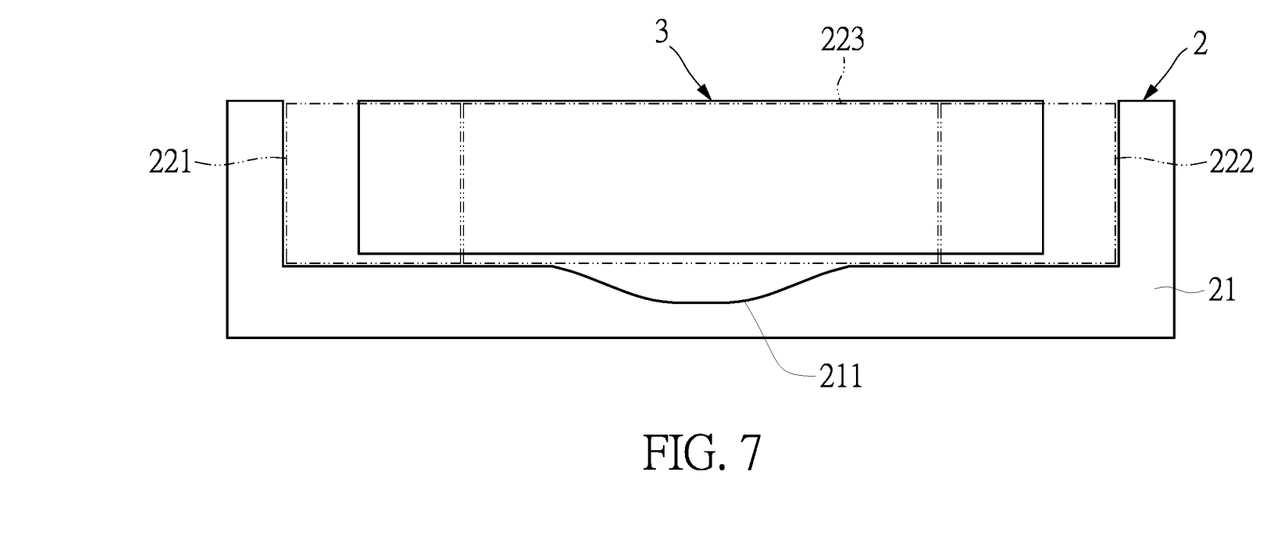
FIG. 7 is another partial top view of the fixation unit and the heat source the heat dissipation structure according to the first embodiment of the present disclosure.

Further, a shape of the at least one recess 211 can be adjusted according to the user's demands or the practical requirements. For example, as viewed in a section along a thickness direction of the fixation 2, the at least one recess 211 may have a rectangular shape (as shown in FIG. 3 to FIG. 5), a jagged edge shape (as shown in FIG. 6), or a circular arc edge shape (as shown in FIG. 7). On the other hand, as viewed in the section along the thickness direction of the fixation 2, the at least one recess 211 may also have a trapezoidal shape. That is, as viewed in the section along the thickness direction of the fixation 2, one side of the at least one recess 211 that is adjacent to the masking area 223 and another side of the at least one recess 211 that is opposite to the one side of the at least one recess 211 may be unequal in length. Nevertheless, the shape of the at least one recess 211 can be appropriately adjusted so that the volume of the heat dissipation unit 1 that is expanded can be concentrated in the at least one recess 211 to avoid the overflow of the heat dissipation unit 1, and the present disclosure does not limit the shape of the at least one recess 211.

It should be noted that, the heat source 3 can be disposed on a carrier substrate, and the heat source 3 can be a central processing unit (CPU), a graphics processing unit (GPU), a microcontroller (MCU), a microprocessor (MPU), an application specific integrated circuit (ASIC), or other electronic components, but the present disclosure is not limited thereto.

In addition, the fixation unit 2 can be surroundingly arranged on the periphery of the heat source 3 according to the user's demands or the practical requirements by conventional techniques. Preferably, the fixation unit 2 can be directly placed on the periphery of the heat source 3. Alternatively, the fixation unit 2 can be adhered to the periphery of the heat source 3 through the insulating tape.

However, the aforementioned details are disclosed for exemplary purposes only, and are not meant to limit the scope of the present disclosure.

Beneficial Effects of the Embodiment

In conclusion, one of the beneficial effects of the present disclosure is that, in the heat dissipation structure provided by the present disclosure, by virtue of "the hollow area 22 has the first non-masking area 221, the second non-masking area 222, and the masking area 223, the masking area corresponds to the at least one part of the heat dissipation unit 1, and the first non-masking area 221 and the second non-masking area 222 are respectively arranged on the opposite sides of the masking area 223", "the first non-masking area 221 has a first volume, the second non-masking area 222 has a second volume, the first volume is equal to or not equal to the second volume, and the sum of the first volume and the second volume is at least greater than the predetermined volume change of the heat dissipation unit 1", and "the fixation unit 2 further has the at least one recess 211, the at least one recess 211 is adjacent to the masking area 223, and the top surface of the at least one recess 211 is adjacent to the at least another part of the heat dissipation unit 1," an electrical leakage during assembly of a metal cooling fin due to an electrical conductivity between components can be reduced, so that an underclocking during operation of a high power chip can be avoided. Moreover, the heat dissipation structure provided by the present disclosure can be applied to solve a problem of high temperature during overclocking, which results in improved stability of heat dissipation during repetitive testing.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A heat dissipation structure, comprising:
a heat dissipation unit; and
a fixation unit having a bottom and a wall, wherein the bottom and the wall jointly define a hollow area;
wherein one part of the heat dissipation unit is disposed on the fixation unit;
wherein the fixation unit is surroundingly arranged on a periphery of a heat source;
wherein the hollow area includes a first non-masking area, a second non-masking area, and a masking area, the masking area corresponds to another part of the heat dissipation unit, and the first non-masking area and the second non-masking area are arranged on opposite sides of the masking area;
wherein the first non-masking area has a first volume, the second non-masking area has a second volume, the first volume is equal to or not equal to the second volume, and a sum of the first volume and the second volume is at least greater than a predetermined volume change of the heat dissipation unit,
wherein a ratio of the sum of the first volume and the second volume to a volume of the heat dissipation unit is at least greater than 0.05.

2. The heat dissipation structure according to claim 1, wherein the heat dissipation unit has a first state and a second state.

3. The heat dissipation structure according to claim 2, wherein the heat dissipation unit is formed by liquid metal.

4. The heat dissipation structure according to claim 3, wherein the ratio of the sum of the first volume and the second volume to the volume of the heat dissipation unit is at least greater than 0.1.

5. The heat dissipation structure according to claim 1, wherein the fixation unit further has at least one recess, the at least one recess is adjacent to the masking area.

6. The heat dissipation structure according to claim 5, wherein, as viewed in a section along a thickness of the fixation unit, the at least one recess has a rectangular shape, a jagged edge shape, or a circular arc edge shape.

7. The heat dissipation structure according to claim 5, wherein, as viewed in a section along a thickness of the fixation unit, the at least one recess has a trapezoidal shape.

8. The heat dissipation structure according to claim 1, wherein the heat source is a central processing unit (CPU), a graphics processing unit (GPU), a microcontroller (MCU), a microprocessor (MPU), or an application specific integrated circuit (ASIC).

9. The heat dissipation structure according to claim 1, wherein the heat dissipation unit is adhered to a top surface of each of two parts of the wall of the fixation unit that are opposite to each other through an insulating tape.

10. The heat dissipation structure according to claim 1, wherein the fixation unit is directly placed on the periphery of the heat source, or the fixation unit is adhered to the periphery of the heat source through an insulating tape.

* * * * *